United States Patent
Dzengeleski et al.

(10) Patent No.: US 7,521,691 B2
(45) Date of Patent: Apr. 21, 2009

(54) MAGNETIC MONITORING OF A FARADAY CUP FOR AN ION IMPLANTER

(75) Inventors: Joseph P. Dzengeleski, Newton, NH (US); Morgan D. Evans, Manchester, MA (US); Jay Scheuer, Rowley, MA (US); Ashwin Shetty, Burlington, MA (US); Kenneth Swenson, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 297 days.

(21) Appl. No.: 11/608,595

(22) Filed: Dec. 8, 2006

(65) Prior Publication Data

US 2008/0135776 A1   Jun. 12, 2008

(51) Int. Cl.
| | |
|---|---|
| G01K 1/08 | (2006.01) |
| H01J 3/14 | (2006.01) |
| H01J 3/26 | (2006.01) |
| A61N 5/00 | (2006.01) |
| G21G 5/00 | (2006.01) |
| G21K 5/10 | (2006.01) |
| H01J 37/08 | (2006.01) |

(52) U.S. Cl. ............... 250/397; 250/492.1; 250/492.21; 250/492.3

(58) Field of Classification Search ............... 250/492.2, 250/492.21, 492.3, 423 R, 397
See application file for complete search history.

(56) References Cited

U.S. PATENT DOCUMENTS

| | | | |
|---|---|---|---|
| 4,011,449 A | 3/1977 | Ko et al. | |
| 4,223,200 A * | 9/1980 | Moench et al. | 219/121.12 |
| 6,323,497 B1 | 11/2001 | Walther | |
| 6,723,998 B2 | 4/2004 | Bisson et al. | |
| 2002/0070347 A1 | 6/2002 | Bisson et al. | |
| 2004/0113093 A1 | 6/2004 | Mack | |
| 2006/0076510 A1 | 4/2006 | Chang et al. | |

FOREIGN PATENT DOCUMENTS

| | | |
|---|---|---|
| JP | 59163745 A | 9/1984 |
| JP | 61227357 A | 10/1986 |
| WO | 0221565 A2 | 3/2002 |
| WO | 02082496 A2 | 10/2002 |

* cited by examiner

Primary Examiner—Jack I Berman
Assistant Examiner—Brooke Purinton

(57) ABSTRACT

This disclosure provides an approach for magnetic monitoring of a Faraday cup for an ion implanter. In this disclosure, there is a vacuum chamber and a Faraday cup located within the vacuum chamber. The Faraday cup is configured to move within the path of an ion beam entering the vacuum chamber. A magnetic monitor located about the vacuum chamber, is configured to distinguish a magnetic field associated with the Faraday cup from stray magnetic fields.

32 Claims, 6 Drawing Sheets

MAGNETIC MONITORING OF A FARADAY CUP FOR AN ION IMPLANTER

TECHNICAL FIELD

This disclosure relates generally to ion implantation of workpieces, and more specifically to monitoring the performance of a Faraday Cup used in an ion implantation operation.

BACKGROUND

Ion implantation is a standard technique for introducing conductivity-altering impurities into workpieces such as semiconductor wafers. In a conventional beamline ion implanter, an ion source generates an ion beam and extraction electrodes extract the beam from the source. An analyzer magnet receives the ion beam after extraction and filters selected ion species from the beam. The ion beam passing through the analyzer magnet then enters an electrostatic lens comprising multiple electrodes with defined apertures that allow the ion beam to pass through. By applying different combinations of voltage potentials to the multiple electrodes, the electrostatic lens can manipulate ion energies. A corrector magnet shapes the ion beam generated from the electrostatic lens into the correct form for deposition onto the workpiece. A deceleration stage comprising a deceleration lens receives the ion beam from the corrector magnet and further manipulates the energy of the ion beam before it hits the workpiece. As the beam hits the workpiece, the ions in the beam penetrate the surface of the workpiece coming to rest beneath the surface to form a region of desired conductivity.

In the operation of the conventional ion implanter, it is usually necessary to measure the cumulative ion dose implanted in the workpiece and the dose uniformity over the surface area of the wafer. A Faraday cup is one type of device used to measure the cumulative ion dose implanted in the workpiece as well as the dose uniformity over the surface area of the wafer. In operation, the Faraday cup, positioned in the vicinity of the target workpiece, receives the ion beam at selected intervals of the ion implantation. The ion beam passes into the Faraday cup and produces an electrical current which is representative of ion beam current. The Faraday cup supplies the electrical current to an electronic dose processor, which integrates the current with respect to time to determine the cumulative ion dose. The dose processor may be part of a feedback loop that can control the ion dose of the ion implanter. Faraday cups may also be used to monitor beam current at other locations along the beam line.

One type of Faraday cup used with an ion implanter has a cup body that defines a chamber which has an entrance aperture to receive the ion beam. This type of Faraday cup has a suppression electrode positioned in proximity to the entrance aperture to produce electric fields for inhibiting stray ions from entering the chamber. Also, the Faraday cup has a magnet assembly positioned to produce magnetic fields that not only inhibit the escape of electrons originating in the chamber, but also inhibit stray electrons from entering the chamber.

A problem that can rise from using such a Faraday cup with the ion implanter is that shifts in ion dose can occur when the ability of the magnet assembly to inhibit or suppress stray electrons from escaping the chamber has been compromised. A shift in ion dose can result in workpieces not having the desired conductivity and sometimes may lead to scrapping of workpieces. Errors in monitored beam current can also occur if the magnetic suppression is compromised. If the magnetic field associated with the magnet assembly in the Faraday cup were monitored, it is likely that shifts in ion dose or errors in monitored beam current could be detected earlier and corrected before serious doping problems arose that would necessitate scrapping workpieces. Because there are several magnetic fields present in a typical ion implanter, some of which are larger than the Faraday cup field and vary from recipe to recipe, it is difficult to distinguish between the magnetic field attributed to the magnet assembly in the Faraday cup and stray magnetic fields that arise from the analyzer magnet, corrector magnet and other sources in the vicinity that may produce a magnetic field. As a result, there are no approaches available that provide a reliable methodology for monitoring the magnetic field associated with the magnet assembly in the Faraday cup.

SUMMARY

Therefore, there is a need for a reliable methodology that can monitor the magnetic field associated with the Faraday cup. In some cases, there is also a need for a monitor that has the sensitivity to distinguish between the magnetic field associated with the Faraday cup and any stray magnetic fields.

In one embodiment, there is system for remote magnetic monitoring of an ion implantation operation. In this embodiment, there is a vacuum chamber and a Faraday cup located within the vacuum chamber. The Faraday cup is configured to move within the path of an ion beam entering the vacuum chamber. A magnetic monitor located about the vacuum chamber, is configured to distinguish a magnetic field associated with the Faraday cup from stray magnetic fields.

In a second embodiment, there is a system for in-situ magnetic monitoring of a Faraday cup in an ion implanter. In this embodiment, there is a vacuum chamber and a Faraday cup located within the vacuum chamber. The Faraday cup is configured to move within the path of an ion beam entering the vacuum chamber. At least one magnetic monitor located about the vacuum chamber, is configured to measure the magnetic field as the Faraday cup moves within the vacuum chamber. A magnetic monitor processor is configured to receive signals generated from the at least one magnetic monitor that are indicative of the measured magnetic field. The magnetic monitor processor is also configured to determine an amount of the measured magnetic field that is attributed to the Faraday cup and an amount of the measured magnetic field that is attributed to stray magnetic fields.

In a third embodiment, there is an ion implanter comprising an ion source configured to generate an ion beam. A magnet is configured to bend the path of the ion beam. A vacuum chamber is configured to receive the ion beam from the magnet. A Faraday cup located within the vacuum chamber, is configured to move within the path of the ion beam in the vacuum chamber. A magnetic monitor located about the vacuum chamber, is configured to measure the magnetic field as the Faraday cup moves within the vacuum chamber. A magnetic monitor processor is configured to receive magnetic field measurements generated from the magnetic monitor. The magnetic monitor processor is configured to determine an amount of the measured magnetic field that is attributed to the Faraday cup and an amount of the measured magnetic field that is attributed to stray magnetic fields.

In a fourth embodiment, there is a method for remote magnetic monitoring of an ion implantation operation. In this embodiment, the method comprises placing a magnetic monitor about a vacuum chamber; directing an ion beam to the vacuum chamber; moving a Faraday cup within the path of the ion beam entering the vacuum chamber, wherein the Faraday moves from a retracted position to an extended position; using the magnetic monitor to obtain a first magnetic field measurement in response to the Faraday cup being in the retracted position and a second magnetic field measurement in response to the Faraday cup being in the extended position; and determining the magnetic field attributed to the Faraday cup and the magnetic field attributed to stray magnetic fields according to the first magnetic field measurement and the second magnetic field measurement.

In a fifth embodiment, there is a system for magnetic monitoring of an ion implantation operation in an ion implanter. In this embodiment, there is a Faraday cup located along the beamline of the ion implanter. A magnetic monitor located within the Faraday cup is configured to obtain a magnetic field measurement.

In a sixth embodiment, there is a method for magnetic monitoring of an ion implantation operation in an ion implanter. In this embodiment, the method comprises locating a Faraday cup along the beamline of the ion implanter; placing a magnetic monitor within the Faraday cup; and obtaining a magnetic field measurement with the magnetic monitor.

In a seventh embodiment, there is a system for magnetic monitoring of an ion implantation operation in an ion implanter. In this embodiment, there is at least one Faraday cup located along the beamline of the ion implanter. A magnetic monitor is located within the at least one Faraday cup and configured to obtain a magnetic field measurement. A magnetic monitor processor is configured to receive the magnetic field measurement.

In an eighth embodiment, there is an ion implanter. In this embodiment, there is an ion source configured to generate an ion beam. A magnet is configured to bend the path of the ion beam. A first Faraday cup is located within the path of the ion beam passing through the magnet. A first magnetic monitor is located within the first Faraday cup and is configured to measure magnetic field of the ion beam passing through the magnet. A vacuum chamber is configured to receive the ion beam from the magnet. A second Faraday cup is located within the vacuum chamber and is configured to move within the path of the ion beam in the vacuum chamber. A second magnetic monitor is located about the vacuum chamber and is configured to measure magnetic field as the second Faraday cup moves within the vacuum chamber. A magnetic monitor processor is configured to receive magnetic field measurements generated from the first and second magnetic monitor.

DETAILED DESCRIPTION

Figure 1:
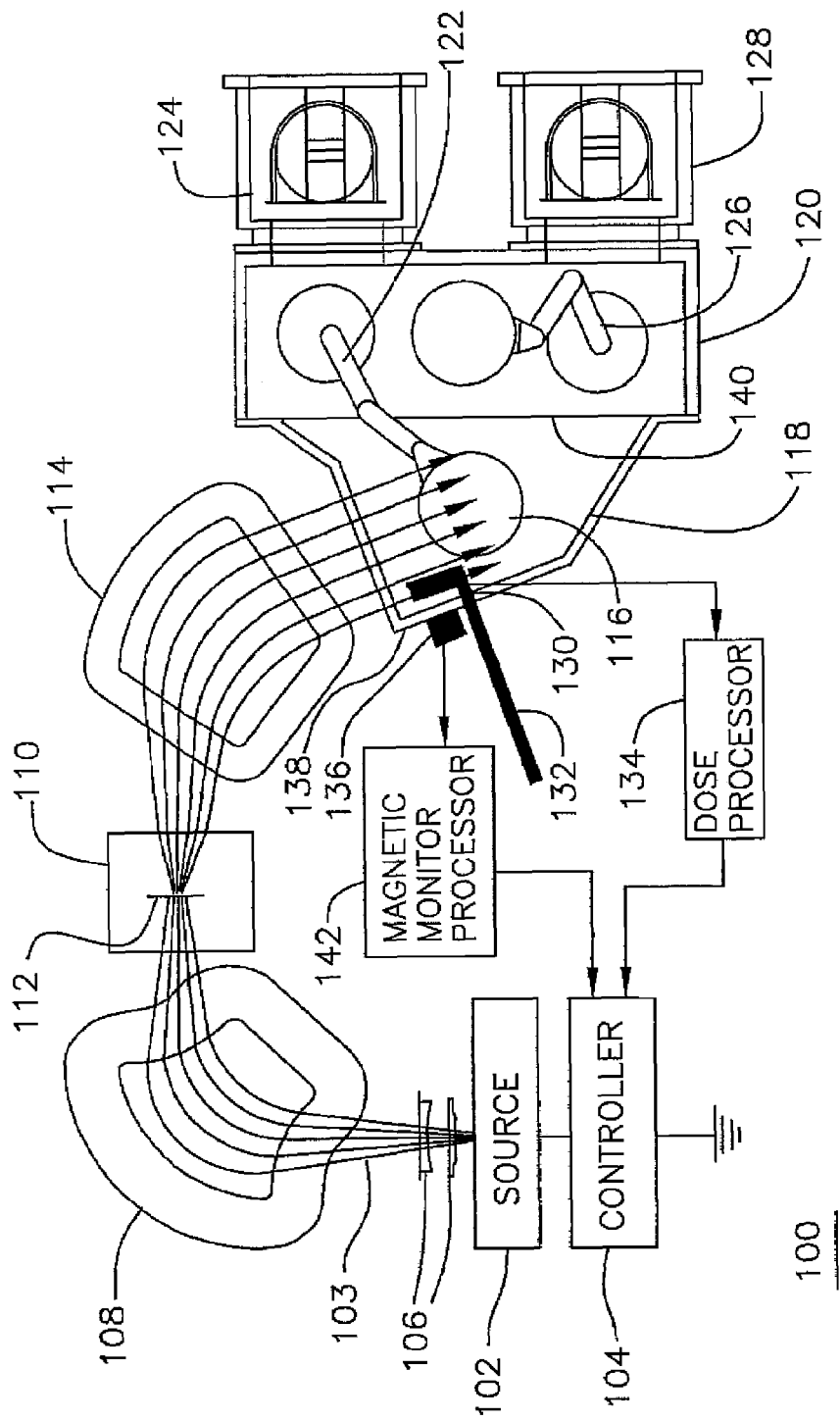
FIG. 1 shows a schematic top view of an ion implanter according to one embodiment of the disclosure.

FIG. 1 shows a schematic top view of an ion implanter 100 according to one embodiment of the disclosure. The ion implanter 100 comprises an ion source 102, such as a plasma source, controlled by a source bias voltage controller 104. The ion source 102 generates a stream of charged particles, known as an ion beam 103. Extraction electrodes 106 receive the ion beam 103 from the ion source 102 and accelerate the positively charged ions within the beam leaving the source 102. An analyzer magnet 108, such as a 90° deflection magnet, receives the ion beam 103 after positively charged ions have been extracted from the source 102 and accelerates and filters unwanted species from the beam. In particular, as the ion beam 103 enters the analyzer magnet 108, a magnetic field directs the ion species into circular paths. Heavier ions will have larger radii of curvature and strike the outer wall of the analyzer magnet 108; lighter ions have smaller radii of curvature and will strike the inner wall of the magnet. Only ions having the needed mass-to-charge ratio will pass through the analyzer magnet 108. The ion beam 103 passing through the analyzer magnet 108 then enters an electrostatic lens 110, which includes a mass slit 112 which further removes unwanted ions (ion masses) from the beam and multiple electrodes (not shown) with defined apertures to allow the ion beam to pass therethrough.

A corrector magnet 114, such as a 45° degree corrector magnet, collimates the ion beam 103 generated from the electrostatic lens 110 into the correct form for deposition onto a workpiece 116 such as a semiconductor wafer. Although not shown, a deceleration stage comprising a deceleration lens can receive the ion beam 103 from the corrector magnet 114 and further manipulate the energy of the beam before it enters a vacuum chamber 118 and hits the workpiece 116.

A workpiece handling chamber 120 loads the workpiece 116 in the vacuum chamber 118 so that the workpiece can undergo the ion implantation operation. The workpiece handling chamber 120 uses a transport mechanism 122 such as load lock to remove a workpiece from a loading cassette 124 or workpiece holder and introduces it to the vacuum chamber 118 for ion implantation. In particular, the transport mechanism 122 places the workpiece 116 in the vacuum chamber 118 in the path of the ion beam 103 such that the beam hits the workpiece, causing the ions in the beam to penetrate the surface of the workpiece and come to rest beneath the surface to form a region of desired conductivity. After completing the processing of the workpiece 116, another transport mechanism 126 transports the workpiece from the vacuum chamber 118 back to a processed cassette 128 or workpiece holder. This process of loading, processing, removing and storing workpieces continues until all of the workpieces in the loading cassette have undergone the ion implantation operation.

During the processing of the workpiece 116, a Faraday cup 130, located in the vacuum chamber 118, measures the cumulative ion dose implanted in the workpiece and the dose uniformity over the surface area of the wafer. The Faraday cup 130 is attached to a shaft 132 which is driven by a motor (not shown). In operation, the motor drives the Faraday cup 130 through the ion beam directed into the vacuum chamber 118. The ion beam 103 passes through the Faraday cup 130 and produces an electrical current in the cup that is representative of ion beam current. The Faraday cup 130 supplies the electrical current to an electronic dose processor 134, which integrates the current with respect to time to determine the cumulative ion dose. In one embodiment, the dose processor 134 may be a general purpose computer that is programmed for controlling dose and dose uniformity of implanted workpieces. In another embodiment, the dose processor 134 may be a special purpose controller or a local controller that is partially or fully dedicated to dose measurement and control. The dose processor 134 supplies the cumulative ion dose determination to the controller 104 which can control the ion beam 103 generated from the source 102.

Figure 2:
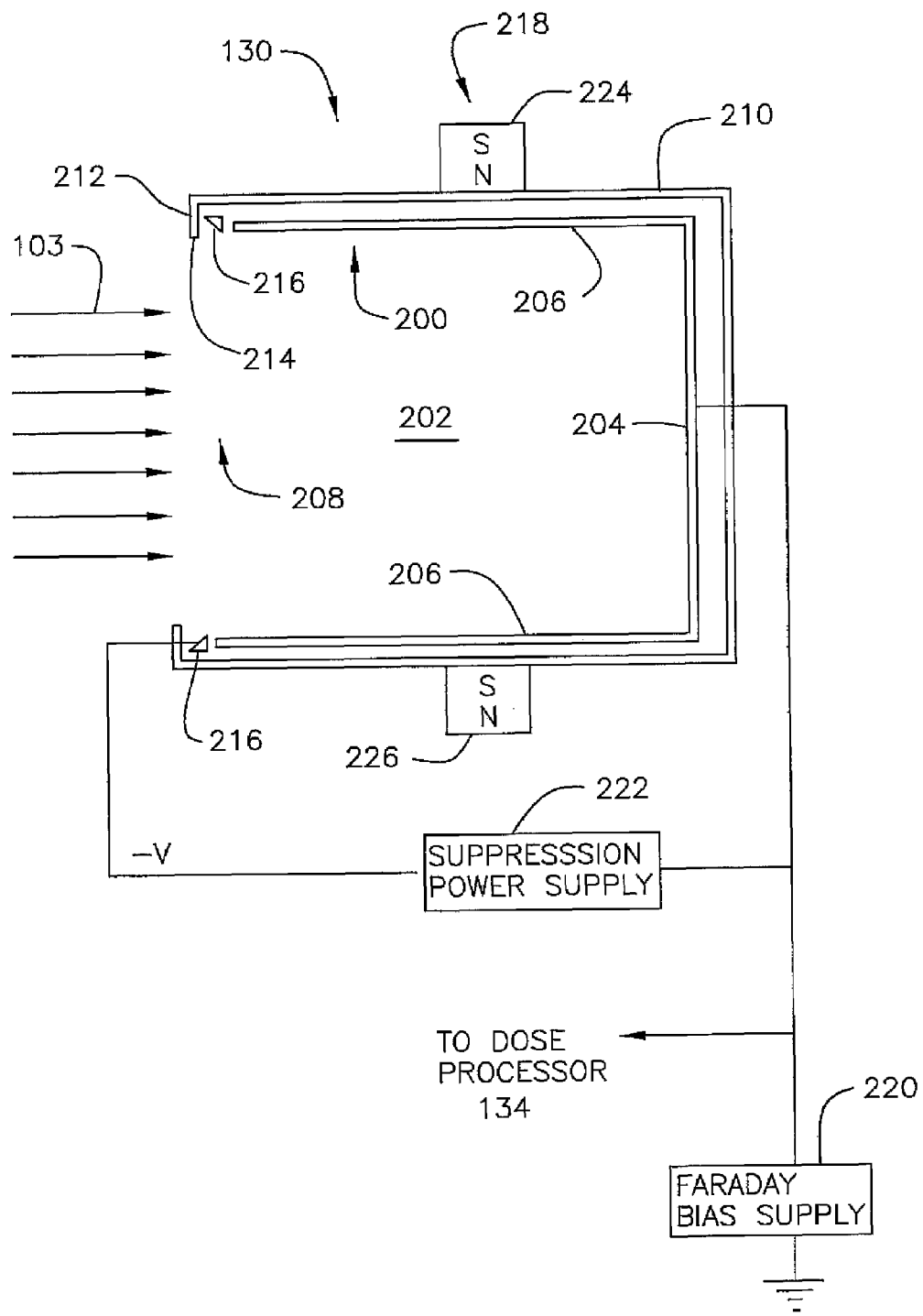
FIG. 2 shows a more detailed view of a Faraday cup shown in FIG. 1.

FIG. 2 shows a more detailed view of the Faraday cup 130 according to one embodiment. In FIG. 2, the Faraday cup 130 includes a cup body 200 which defines a chamber 202 for receiving the ion beam 103. The Faraday cup body 200 is electrically conductive and includes an end wall 204, side walls 206 and an open portion 208. The Faraday cup 130 further includes a housing 210 that encloses Faraday cup body 200. The housing 210 includes a front plate 212 having an opening that defines an entrance aperture 214 of chamber 202. The Faraday cup 130 further includes a suppression electrode 216 positioned in proximity to the entrance aperture 214 and a magnet assembly 218 which produces magnetic fields in chamber 202 for inhibiting escape of electrons from the chamber.

FIG. 2 shows the Faraday cup 130 having a connection to the dose processor 134 to supply signals representative of the ion beam current received through entrance aperture 214. When the dose processor 134 determines that a predetermined ion dose level is reached, the processor will notify the controller 104 (shown in FIG. 1) which will terminate the ion implantation operation. FIG. 2 also shows the Faraday cup 130 having a connection to a Faraday bias supply 220 which permits the cup body 200 to be biased at a desired potential. Housing 210 is preferably connected to a reference potential, such as ground, and is electrically isolated from the Faraday cup body 200. The suppression electrode 216 may be connected to a suppression power supply 222 which supplies a bias voltage to suppression electrode 216. Typically, the suppression electrode 216 is biased negatively with respect to Faraday cup body 200. In addition, the suppression electrode 216 is electrically isolated from Faraday cup body 200 and housing 210.

In order to provide accurate measurements of ion beam current over the range of operating conditions for the ion implantation, all or most of the ion beam should be intercepted by the Faraday cup 130. In operation, energetic ions enter Faraday cup body 200 and impinge on surfaces within the cup body causing generation of secondary electrons. The secondary electrons may impinge on surfaces within the Faraday cup body 200 and generate tertiary electrons. Escape of secondary and tertiary electrons from the Faraday cup body 200 causes a measurement error. The suppression electrode 216 and magnet assembly 218 are helpful in inhibiting the escape of secondary and tertiary electrons from the Faraday cup 130. The suppression electrode 216 which is positioned in proximity to entrance aperture 214, produces electric fields which inhibit escape of electrons from the chamber 202. The magnet assembly 218 produces magnetic fields in chamber 202 which inhibit escape of electrons from the chamber.

FIG. 2 shows that the magnet assembly 218 includes a first magnet 224 and a second magnet 226 mounted on opposite sides of housing 210. Magnet assembly 218 is preferably configured such that first magnet 224 and second magnet 226 have opposite poles facing chamber 202. The magnetic fields generated by magnets 224 and 226 further inhibit escape of secondary and tertiary electrons from chamber 202.

Additional details of a Faraday cup system are provided in U.S. Pat. No. 6,723,998.

A problem that can rise from using the Faraday cup 130 with the ion implanter 100 is that shifts in ion dose can occur when the ability of the magnet assembly 218 to inhibit or suppress electrons from escaping the chamber 202 is compromised. A shift in ion dose can result in workpieces that do not have the desired conductivity and sometimes may lead to scrapping of workpieces. Also, errors in monitored beam current can occur if the magnetic suppression is compromised. If the magnetic field associated with the magnet assembly 218 were monitored, it is likely that shifts in ion dose or errors in monitored beam current could be detected earlier and corrected before serious doping problems arose. Because there are several magnetic fields present in a typical ion implanter, from sources other than the magnet assembly 218, such as analyzer magnet 108, corrector magnet 114 and possibly other sources in the vicinity, it is difficult to distinguish between the magnetic field attributed to the magnet assembly 218 and the stray magnetic fields.

Referring back to FIG. 1, this disclosure has overcome the problem of distinguishing between the magnetic field attributed to the magnet assembly 218 and the stray magnetic fields associated with the analyzer magnet 108, corrector magnet 114 and other sources in the vicinity by utilizing a magnetic monitor 136 located about the vacuum chamber 118. In one embodiment, the magnetic monitor 136 is located outside of the vacuum chamber 118, coupled to a wall 138 of the vacuum chamber 118 and is configured to obtain magnetic field measurements when the Faraday cup 130 is in a retracted or home position and an extended position. In the retracted position, the Faraday cup 130 is adjacent to the wall 138 of the vacuum chamber 118 and proximate to the magnetic monitor 136. Also, in the retracted position, the Faraday cup 130 will not be in the path of the ion beam 103. In the extended position, the Faraday cup 130 is adjacent to a wall 140 of the vacuum chamber that is opposite from the wall 138 and distant to the magnetic monitor 136. In the extended position, the Faraday cup 130 will be in the path of the ion beam 103. The first magnetic field measurement taken in the retracted position provides a maximum signal that is indicative of the magnetic field associated with the magnet assembly 218 in the Faraday cup 130 and the second magnetic field measurement provides a minimum signal and is indicative of the stray magnetic fields.

Those skilled in the art will recognize that the magnetic monitor 136 may be coupled to the vacuum chamber 118 at various locations outside the chamber that are different than the position shown in FIG. 1, and still be able to obtain in-situ measurements of the Faraday cup 130 in the retracted position and extended position. In addition, those skilled in the art will recognize that the magnetic monitor 136 may be located at various locations within the vacuum chamber 118. In particular, the magnetic monitor 136 may be placed on the inner wall of the vacuum chamber, i.e., the drive shaft 132 adjacent the Faraday cup 130 or within the Faraday cup. For the embodiment where the magnetic monitor 136 is located within the Faraday cup 130, any stray magnetic fields that arise from sources other than the magnet assembly within the Faraday cup can be neglected because the strength of the response from the monitor in the cup will be much greater than any stray field. In this embodiment, the Faraday cup 130 in the vacuum chamber 118 could be either stationary or moveable with respect to the ion beam 103.

In one embodiment, the magnetic monitor 136 comprises a magnetic sensing device. The magnetic sensing device may comprise a Hall probe, magnetically actuated switch, magnetic proximity sensor, Magnetodiode, or an anisotropic magnetoresistance (AMR) sensor. The Hall probe, magnetically actuated switch, magnetic proximity sensor, Magnetodiode and AMR sensor are only examples of possible magnetic sensing devices that can be used to obtain magnetic field measurements of the magnetic assembly 218 in the Faraday cup 130 and is not meant to be limiting of other magnetic sensing devices. For example, it is possible to use a wire coil to measure the magnetic field as the Faraday cup moves within the vacuum chamber 118.

Referring back to FIG. 1, a magnetic monitor processor 142 receives magnetic field measurements generated from the magnetic monitor 136. The magnetic monitor processor 142 uses the magnetic field measurements to determine an amount of the measured magnetic field that is attributed to the magnet assembly 218 of the Faraday cup 130 and an amount of the measured magnetic field that is attributed to stray magnetic fields such as the analyzer magnet 108, corrector magnet 114 and other stray magnetic field in the vicinity of the ion implanter 100. In particular, the magnetic monitor processor 142 determines the difference between the first magnetic field measurement taken in the retraction position and the second magnetic field measurement taken in the extended position. The difference is indicative of the measured magnetic field that is attributed to the Faraday cup 130.

The magnetic monitor processor 142 is able to ascertain the magnetic field that is attributed to the Faraday cup 130 from the difference because the first magnetic field measurement taken in the retracted position is indicative of the magnetic field associated with the magnetic assembly 218 in the Faraday cup 130 and the second magnetic field measurement is indicative of the stray magnetic fields associated with items such as the analyzer magnet 108, corrector magnet 114 and other stray magnetic fields. For instance, if the magnetic monitor 136 obtains a magnetic field measurement of 5.1 units when the Faraday cup 130 is in the retracted position and a magnetic field measurement of 5.0 units when the Faraday cup 130 is in the extended position, the difference will be 0.1 units. From this difference, the magnetic monitor processor 142 will ascertain that 5 parts of the measurement are due to the stray magnetic fields and 1 part is due to the Faraday cup 130.

The magnetic monitor processor 142 has the capability to generate a warning to an operator of the ion implanter if the amount of the measured magnetic field that is attributed to the Faraday cup 130 reaches a predetermined magnetic field threshold. The magnetic monitor processor 142 is also configured to cease ion implantations if the amount of the measured magnetic field that is attributed to the Faraday cup reaches a predetermined magnetic field threshold. The magnetic monitor processor 142 facilitates these operations by notifying the controller 104 which implements the desired actions to perform.

In one embodiment, the magnetic monitor processor 142 may be a general purpose computer that is programmed for monitoring the magnetic measurements obtained by the magnetic monitor 136. In another embodiment, the magnetic monitor processor 142 may be a special purpose controller or a local controller that is partially or fully dedicated to monitoring the magnetic measurements.

For ease of illustration, FIG. 1 only shows components of the ion implanter 100 that will facilitate a general understanding of the approach for monitoring the magnetic field of the Faraday cup 130. Those skilled in the art will recognize that the ion implanter 100 can have additional components not shown in FIG. 1.

Figure 3:
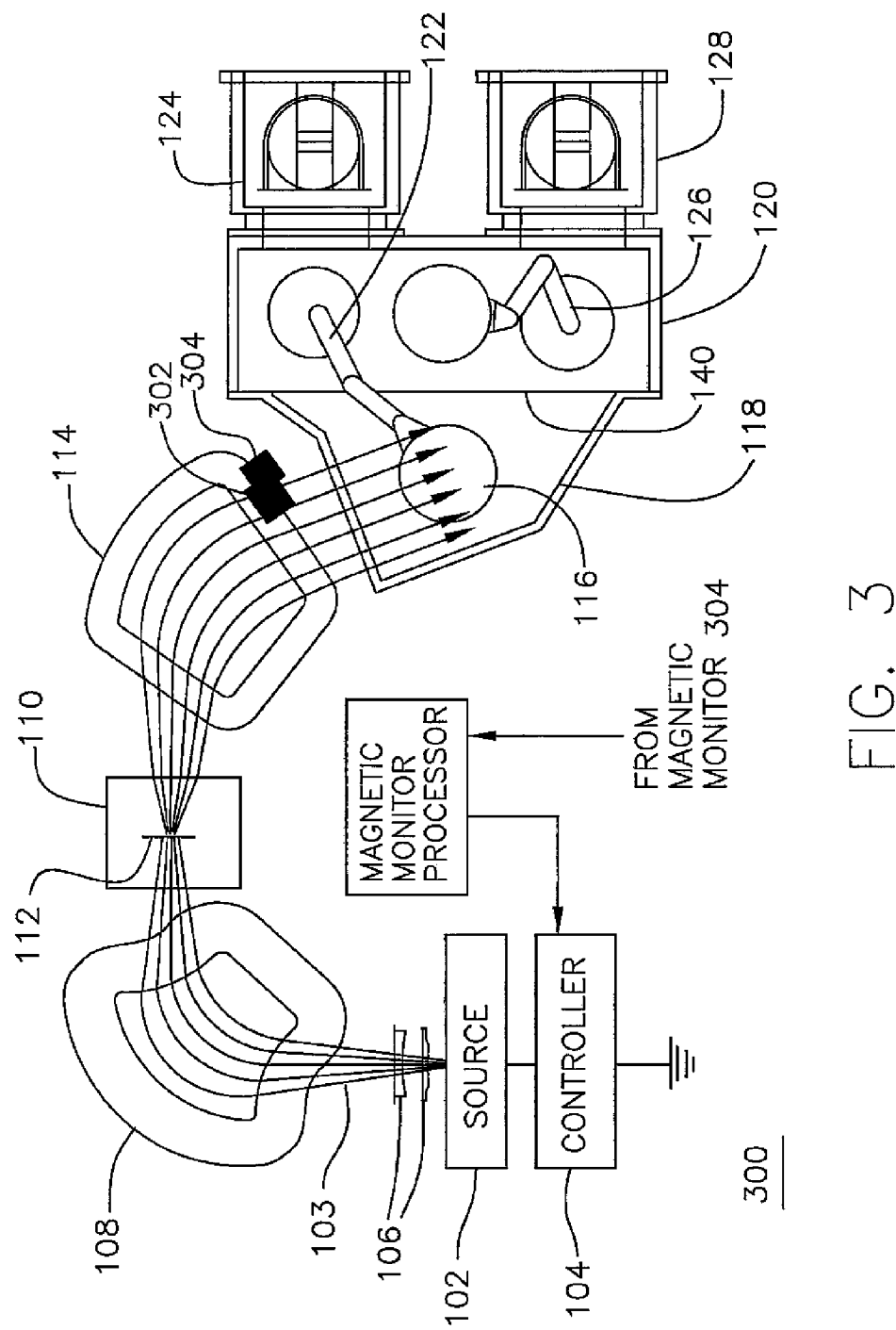
FIG. 3 shows a schematic top view of an ion implanter having a Faraday cup within the beamline of the ion implanter according to one embodiment of the disclosure.

Also, in another embodiment, since Faraday cups may be used to monitor beam current at other locations along the beamline, the Faraday cup 130 may be placed at locations that include but are not limited to the analyzer magnet 108, electrostatic lens 110 and the corrector magnet 114. FIG. 3 shows a schematic top view of an ion implanter 300 with a Faraday cup 302 located within the beamline of the ion beam 103 as it passes through the corrector magnet 114. In this embodiment, a magnetic monitor 304 is placed within the assembly of the Faraday cup 302 to obtain a magnetic field measurement. With the proximity of the magnetic monitor 304 to the Faraday cup 302 any stray magnetic fields that arise from sources other than the magnet assembly within the Faraday cup are neglected because the strength of the response from the monitor in the cup is much greater than any stray field. In this embodiment, the Faraday cup 302 could be either stationary or moveable with respect to the ion beam 103 as described above.

In embodiments where a Faraday cup is stationary with respect to the ion beam 103, whether in the vacuum chamber 118 or in the beamline, the magnetic monitor processor 142 will receive the magnetic field measurement and take actions as described above, if the measurement from the magnetic monitor is above a predetermined magnetic field threshold.

Figure 4:
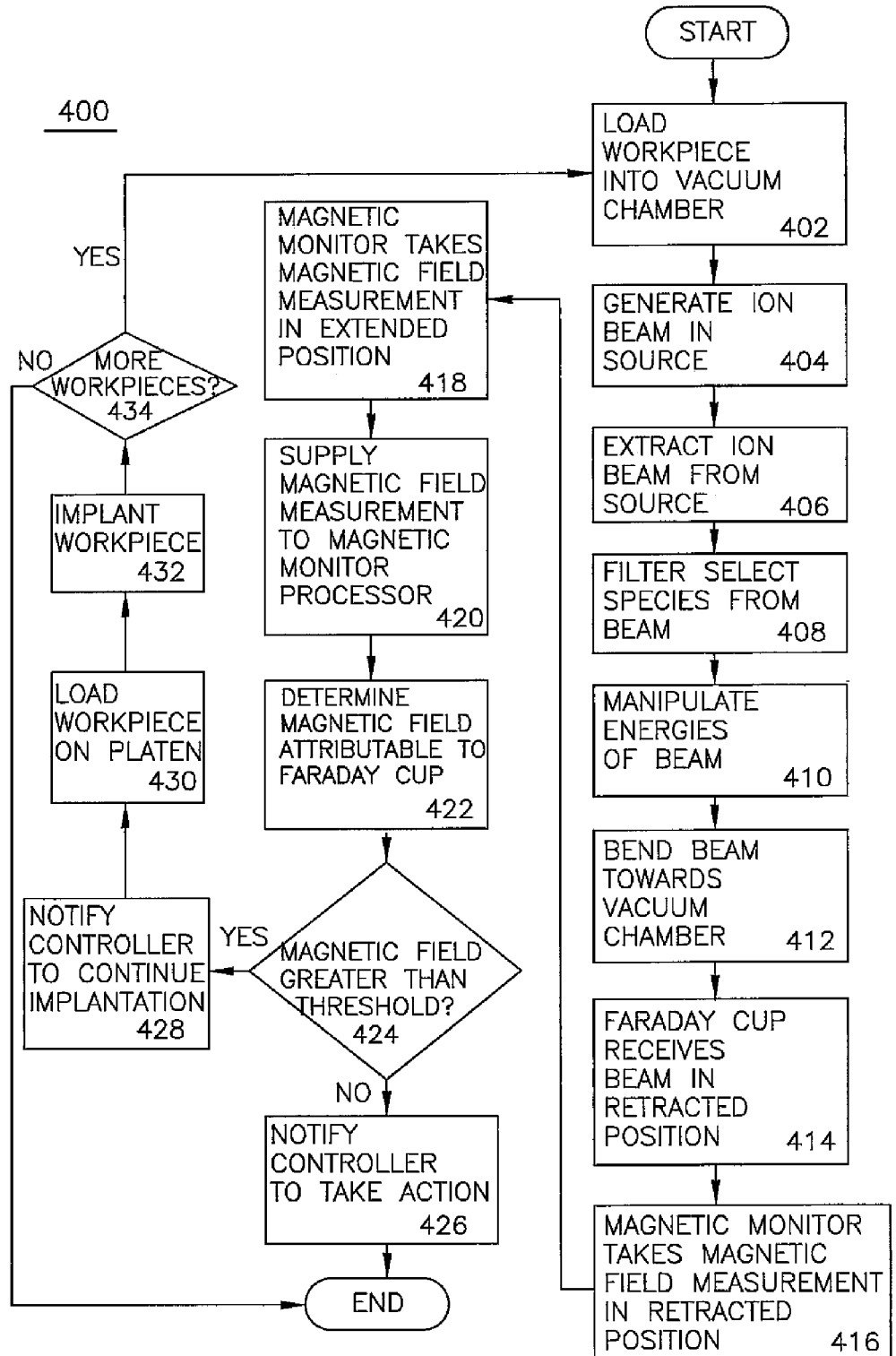
FIG. 4 shows a flow chart describing the operation of the ion implanter shown in FIG. 1, including a method for magnetic monitoring of the Faraday cup utilized, according to one embodiment of this disclosure.

FIG. 4 shows a flow chart 400 describing the operation of the ion implanter 100, including a method for magnetic monitoring of the Faraday cup 130 according to one embodiment of this disclosure. The operation of the ion implanter 100 begins at 402 where the transport mechanism 122 in the workpiece handling chamber 120 removes a workpiece from the loading cassette 124 and loads it into the vacuum chamber 118. The ion source 102 then generates an ion beam at 404 and the extraction electrodes 106 extract the beam from the source at 406. The analyzer magnet 108 receives the ion beam after extraction and filters selected ion species from the beam at 408. The electrostatic lens 110 manipulates ion energies of the beam at 410 and the corrector magnet 114 further manipulates the energy of the ion beam bending it to the vacuum chamber 118 at 412 for deposition onto the workpiece 116.

Before the workpiece 116 is ion implanted, the Faraday cup 130 receives the ion beam in the retracted position at 414. The magnetic monitor 136 then takes a magnetic field measurement at 416 as the Faraday cup receives the ion beam in the retracted position. The Faraday cup is then moved across the beam to the extended position, where the magnetic monitor then takes another magnetic field measurement at 418. The magnetic monitor supplies the magnetic field measurements taken at the retracted position and the extended position to the magnetic monitor processor 142 at 420. The magnetic monitor processor 142 determines the difference of the magnetic field measurements at 422 to ascertain the magnetic field that is attributable to the magnet assembly 218 in the Faraday cup 130 as opposed to the magnetic field that is attributable to stray magnetic fields generated from the analyzer magnet 108, corrector magnet 114 and any other sources that may generate stray magnetic fields in the vicinity of the ion implanter 100.

If the magnetic field attributed to the Faraday cup 130 reaches a predetermined threshold level as determined at 424, then magnetic monitor processor 142 notifies the operator via the controller 104 to take action at 426. As mentioned above, such actions may include generating a warning to an operator and/or ceasing ion implantations. Alternatively, if the magnetic field attributed to the Faraday cup 130 does reach the predetermined threshold level as determined at 424, then the magnetic monitor processor 142 notifies the controller 104 to proceed with the ion implantation at 428.

The ion implantation proceeds and the transport mechanism 122 loads a workpiece onto a platen in the process chamber 118 at 430. The ion beam will then hit the workpiece at 432, causing the ions in the beam to penetrate the surface of the workpiece coming to rest beneath the surface to form a region of desired conductivity. If it is determined at 434 that there are no further workpieces for ion implantation, then ion implantation ends, otherwise additional workpieces are implanted. Alternatively, in another embodiment, once the workpiece has been removed from the beam after implantation, the magnetic monitor 136 can then be used to take magnetic field measurements when the Faraday cup 130 is in the retracted and extended positions, repeating actions 414-428 to ensure that a dose shift has not occurred.

The foregoing flow chart shows some of the processing functions associated with the ion implanter 100 and the magnetic monitoring of the Faraday cup 130. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added. For example, there might be blocks to denote that other actions occur during the processing of the magnetic field measurements such as supplying the dose processor 134 with the measurements of the electrical current that are representative of the ion beam current, using the electronic dose processor 134 to determine the cumulative ion dose and providing the results back to the controller to control the ion dose provided to the workpiece 116.

Figure 5:
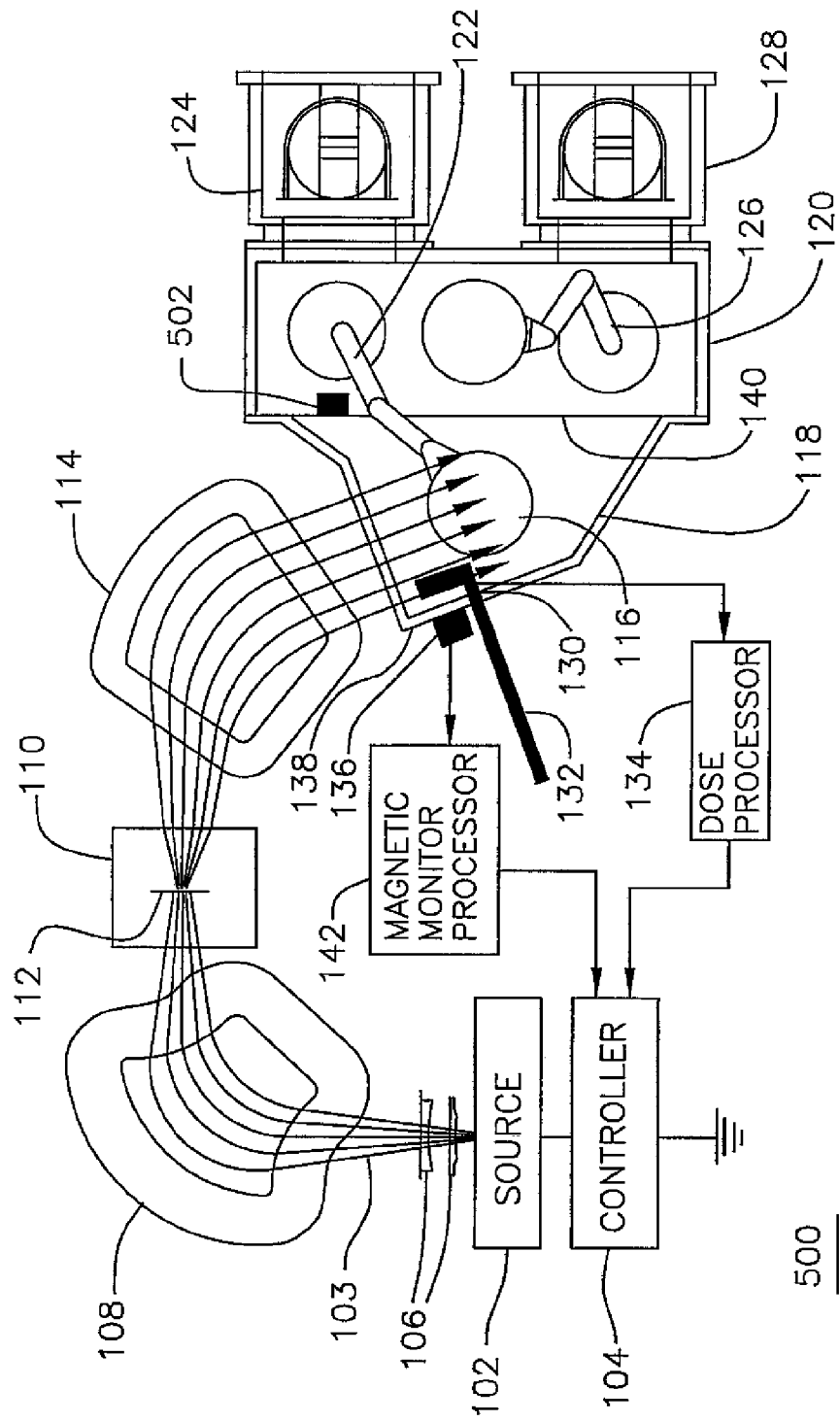
FIG. 5 shows a schematic top view of an ion implanter having multiple Faraday cups and magnetic monitors located about the vacuum chamber according to another embodiment of the disclosure.

FIG. 5 shows a schematic top view of an ion implanter 500 according to another embodiment of the disclosure. The ion implanter 500 of FIG. 5 is substantially similar to the implanter 100 shown in FIG. 1, except that implanter 500 includes an additional magnetic monitor 502. In this embodiment, the magnetic monitor 502 is also located outside of the vacuum chamber 118, on the wall 140, opposite wall 138 in which magnetic monitor 136 is located. In operation, magnetic monitor 136 obtains a magnetic field measurement when the Faraday cup 130 is in the retracted position and the magnetic monitor 502 obtains another magnetic field measurement when the Faraday cup 130 is moved to the extended position. The magnetic monitor processor 142 receives the magnetic field measurements from the magnetic monitor 136 and magnetic monitor 502 and determines an amount of the measured magnetic field that is attributed to the Faraday cup 130 and an amount of the measured magnetic field that is attributed to stray magnetic fields in the same manner described above. In particular, magnetic monitor processor 142 determines the difference between the first magnetic field measurement and the second magnetic field measurement to ascertain the magnetic field that is attributed to the Faraday cup 130.

Like magnetic monitor 136, magnetic monitor 502 is a magnetic sensing device that may comprise magnetic sensing devices such as a Hall probe, magnetically actuated switch, magnetic proximity sensor, an AMR sensor, Magnetodiode, or even a coil wire. Furthermore, those skilled in the art will recognize that the magnetic monitor 502 may be coupled to the vacuum chamber 118 at a location on wall 140 that is different than the position shown in FIG. 5. Also, it is within the scope of this disclosure to have additional magnetic monitors located about the outside walls of the vacuum chamber. It is also possible to place a magnetic monitor at various locations within the vacuum chamber 118. Some locations may include but are not limited to on the inner wall of the vacuum chamber, i.e., the drive shaft 132 adjacent the Faraday cup 130 or within the cup. For the embodiment where a magnetic monitor is located within the Faraday cup 130, any stray magnetic fields that arise from sources other than the magnet assembly within the Faraday cup can be neglected. In this embodiment, the Faraday cup in the vacuum chamber 118 could be either stationary or moveable with respect to the ion beam 103.

Figure 6:
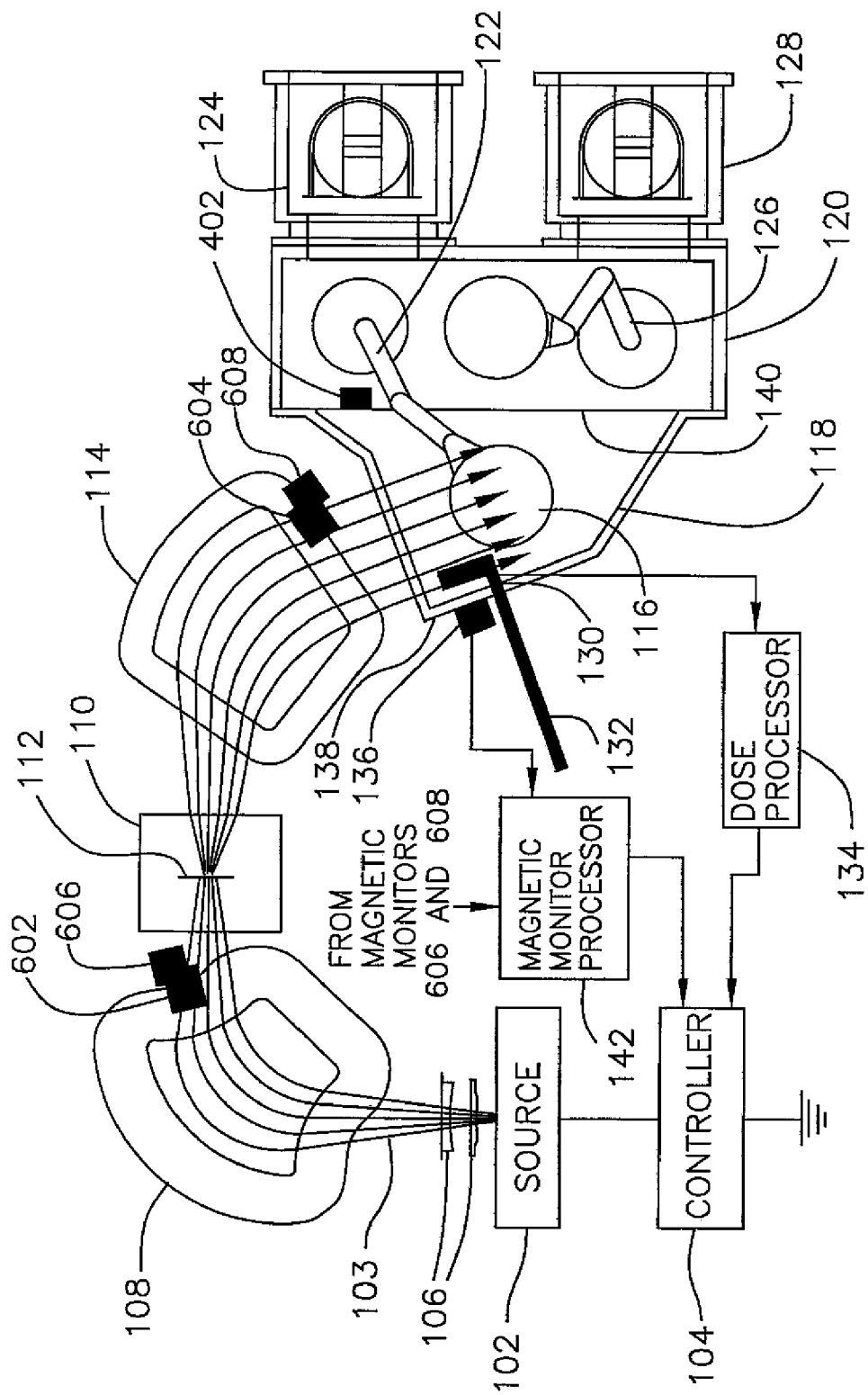
FIG. 6 shows a schematic top view of an ion implanter having multiple Faraday cups and magnetic monitors located about the vacuum chamber and the beamline according to another embodiment of the disclosure.

Also, in another embodiment, it may be desirable to place multiple Faraday cups at other locations along the beam line to monitor beam current at locations that include but are not limited to the analyzer magnet 108, electrostatic lens 110 and the corrector magnet 114. In addition to the Faraday cup 130 used within the vacuum chamber 118, FIG. 6 shows an ion implanter 600 with a Faraday cup 602 located within the beamline of the ion beam 103 as it passes through the analyzer magnet 108 and a Faraday cup 604 located within the beamline of the beam as it passes through corrector magnet 114. In this embodiment, magnetic monitor 606 and 608 are within the assembly of the Faraday cups 602 and 604, respectively, while the magnetic monitor for the Faraday cup 130 is located about the vacuum chamber 118 in a manner described above. Those skilled in the art will recognize that many combinations of magnetic monitors and Faraday cups are possible and thus the disclosure is not limited to the embodiment shown in FIG. 6.

It is apparent that there has been provided with this disclosure an approach for magnetic monitoring of a Faraday cup for an ion implanter. While the disclosure has been particularly shown and described in conjunction with a preferred embodiment thereof, it will be appreciated that variations and modifications can be effected by a person of ordinary skill in the art without departing from the scope of the disclosure.

What is claimed is:

1. A system for remote magnetic monitoring of an ion implantation operation, comprising:
    a vacuum chamber;
    a Faraday cup located within the vacuum chamber, wherein the Faraday cup is configured to move within the path of an ion beam entering the vacuum chamber; and
    a magnetic monitor located about the vacuum chamber, wherein the magnetic monitor is configured to distinguish a magnetic field associated with the Faraday cup from stray magnetic fields.

2. The system according to claim 1, wherein the Faraday cup is configured to move within the vacuum chamber from a retracted position to an extended position, wherein the Faraday cup in the retracted position is proximate to the magnetic monitor, and the Faraday cup in the extended position is distant to the magnetic monitor.

3. The system according to claim 2, wherein the magnetic monitor is configured to obtain a first magnetic field measurement in response to the Faraday cup being in the retracted position and a second magnetic field measurement in response to the Faraday cup being in the extended position.

4. The system according to claim 3, wherein the first magnetic field measurement is indicative of the magnetic field associated with the Faraday cup and the second magnetic field measurement is indicative of the stray magnetic fields.

5. The system according to claim 1, wherein the magnetic monitor comprises a magnetic sensing device.

6. A system for in-situ magnetic monitoring of a Faraday cup in an ion implanter, comprising:
    a vacuum chamber;
    a Faraday cup located within the vacuum chamber, wherein the Faraday cup is configured to move within the path of an ion beam entering the vacuum chamber;

at least one magnetic monitor located about the vacuum chamber, wherein the at least one magnetic monitor is configured to measure magnetic field as the Faraday cup moves within the vacuum chamber; and a magnetic monitor processor configured to receive signals generated from the at least one magnetic monitor that are indicative of the measured magnetic field, wherein the magnetic monitor processor is configured to determine an amount of the measured magnetic field that is attributed to the Faraday cup and an amount of the measured magnetic field that is attributed to stray magnetic fields.

7. The system according to claim 6, wherein the at least one magnetic monitor comprises a first magnetic sensing device and a second magnetic sensing device, wherein the first magnetic sensing device and second magnetic sensing device are located at a location that comprises on a wall of the vacuum chamber or on the Faraday cup.

8. The system according to claim 7, wherein the Faraday cup is configured to move within the vacuum chamber from a retracted position to an extended position, wherein the Faraday cup in the retracted position is proximate to the first magnetic sensing device, and the Faraday cup in the extended position is proximate to the second magnetic sensing device.

9. The system according to claim 8, wherein the first magnetic sensing device obtains a first magnetic field measurement in response to the Faraday cup being in the retracted position and the second magnetic sensing device obtains a second magnetic field measurement in response to the Faraday cup being in the extended position.

10. The system according to claim 9, wherein the first magnetic field measurement is indicative of the magnetic field associated with the Faraday cup and the second magnetic field measurement is indicative of the stray magnetic fields.

11. The system according to claim 10, wherein the magnetic monitor processor is configured to determine the difference between the first magnetic field measurement and the second magnetic field measurement, wherein the difference is indicative of the measured magnetic field that is attributed to the Faraday cup.

12. The system according to claim 6, wherein the at least one magnetic monitor comprises a magnetic sensing device selected from the group consisting of a Hall probe, magnetically actuated switch, magnetic proximity sensor, Magneto-diode, or an AMR sensor.

13. The system according to claim 6, wherein the magnetic monitor processor is configured to generate a warning in response to a determination that the amount of the measured magnetic field that is attributed to the Faraday cup reaches a predetermined threshold.

14. The system according to claim 6, wherein the magnetic monitor processor is configured to control the ion beam entering the vacuum chamber according to the amount of the magnetic field that is attributed to the Faraday cup and the amount of the magnetic field that is attributed to stray magnetic fields.

15. An ion implanter, comprising:
an ion source configured to generate an ion beam;
a magnet configured to bend the path of the ion beam;
a vacuum chamber configured to receive the ion beam from the magnet;
a Faraday cup located within the vacuum chamber, wherein the Faraday cup is configured to move within the path of the ion beam in the vacuum chamber;
a magnetic monitor located about the vacuum chamber, wherein the magnetic monitor is configured to measure magnetic field as the Faraday cup moves within the vacuum chamber; and a magnetic monitor processor configured to receive magnetic field measurements generated from the magnetic monitor, wherein the magnetic monitor processor is configured to determine an amount of the measured magnetic field that is attributed to the Faraday cup and an amount of the measured magnetic field that is attributed to stray magnetic fields.

16. The ion implanter according to claim 15, wherein the Faraday cup is configured to move within the vacuum chamber from a retracted position to an extended position, wherein the Faraday cup in the retracted position is proximate to the magnetic monitor, and the Faraday cup in the extended position is distant to the magnetic monitor.

17. The implanter according to claim 16, wherein the magnetic monitor is configured to obtain a first magnetic field measurement in response to the Faraday cup being in the retracted position and a second magnetic field measurement in response to the Faraday cup being in the extended position.

18. The implanter according to claim 17, wherein the first magnetic field measurement is indicative of the magnetic field associated with the Faraday cup and the second magnetic field measurement is indicative of the stray magnetic fields.

19. The implanter according to claim 17, wherein the magnetic monitor processor is configured to determine the difference between the first magnetic field measurement and the second magnetic field measurement, wherein the difference is indicative of the measured magnetic field that is attributed to the Faraday cup.

20. The implanter according to claim 15, wherein the magnetic monitor processor is configured to generate a warning in response to a determination that the amount of the measured magnetic field that is attributed to the Faraday cup reaches a predetermined threshold.

21. The implanter according to claim 15, wherein the magnetic monitor processor is configured to cease ion implantations in response to a determination that the amount of the measured magnetic field that is attributed to the Faraday cup reaches a predetermined threshold.

22. The implanter according to claim 15, wherein the magnetic monitor processor is configured to control the ion beam entering the vacuum chamber according to the amount of the magnetic field that is attributed to the Faraday cup and the amount of the magnetic field that is attributed to stray magnetic fields.

23. A method for remote magnetic monitoring of an ion implantation operation, comprising:
placing a magnetic monitor about a vacuum chamber;
directing an ion beam to the vacuum chamber;
moving a Faraday cup within the path of the ion beam entering the vacuum chamber, wherein the Faraday moves from a retracted position to an extended position;
using the magnetic monitor to obtain a first magnetic field measurement in response to the Faraday cup being in the retracted position and a second magnetic field measurement in response to the Faraday cup being in the extended position; and
determining the magnetic field attributed to the Faraday cup and the magnetic field attributed to stray magnetic fields according to the first magnetic field measurement and the second magnetic field measurement.

24. The method according to claim 23, wherein the determining of the magnetic field attributed to the Faraday cup and the magnetic field attributed to stray magnetic fields comprises determining the difference between the first magnetic field measurement and the second magnetic field measurement.

25. The method according to claim 23, wherein the first magnetic field measurement is indicative of the magnetic field associated with the Faraday cup and the second magnetic field measurement is indicative of the stray magnetic fields.

26. The method according to claim 23, further comprising generating a warning in response to a determination that the amount of the measured magnetic field that is attributed to the Faraday cup reaches a predetermined threshold.

27. The method according to claim 23, further comprising ceasing the ion implantation operation in response to a determination that the amount of the measured magnetic field that is attributed to the Faraday cup reaches a predetermined threshold.

28. The method according to claim 23, further comprising controlling the ion beam entering the vacuum chamber according to the amount of the magnetic field that is attributed to the Faraday cup and the amount of the magnetic field that is attributed to stray magnetic fields.

29. A system for magnetic monitoring of an ion implantation operation in an ion implanter, comprising:
a Faraday cup located along the beamline of the ion implanter; and
a magnetic monitor located within the Faraday cup, wherein the magnetic monitor is configured to obtain a magnetic field measurement.

30. A method for magnetic monitoring of an ion implantation operation in an ion implanter, comprising:
locating a Faraday cup along the beamline of the ion implanter;
placing a magnetic monitor within the Faraday cup; and
obtaining a magnetic field measurement with the magnetic monitor.

31. A system for magnetic monitoring of an ion implantation operation in an ion implanter, comprising:
at least one Faraday cup located along the beamline of the ion implanter;
a magnetic monitor located within the at least one Faraday cup, wherein the magnetic monitor is configured to obtain a magnetic field measurement; and
a magnetic monitor processor configured to receive the magnetic field measurement.

32. An ion implanter, comprising:
an ion source configured to generate an ion beam;
a magnet configured to bend the path of the ion beam;
a first Faraday cup located within the path of the ion beam passing through the magnet;
a first magnetic monitor located within the first Faraday cup, wherein the first magnetic monitor is configured to measure magnetic field of the ion beam passing through the magnet;
a vacuum chamber configured to receive the ion beam from the magnet;
a second Faraday cup located within the vacuum chamber, wherein the second Faraday cup is configured to move within the path of the ion beam in the vacuum chamber;
a second magnetic monitor located about the vacuum chamber, wherein the second magnetic monitor is configured to measure magnetic field as the second Faraday cup moves within the vacuum chamber; and
a magnetic monitor processor configured to receive magnetic field measurements generated from the first and second magnetic monitor.

* * * * *